(12) United States Patent
Weichart et al.

(10) Patent No.: US 11,143,416 B2
(45) Date of Patent: Oct. 12, 2021

(54) RADIATION HEATER ARRANGEMENT

(71) Applicant: Evatec Advanced Technologies AG, Balzers (LI)

(72) Inventors: Juergen Weichart, Balzers (LI); Rolf Bazlen, Rorschach (CH)

(73) Assignee: EVATEC AG, Trübbach (CH)

(*) Notice: Subject to any disclaimer, the term of this patent is extended or adjusted under 35 U.S.C. 154(b) by 33 days.

(21) Appl. No.: 14/908,206

(22) PCT Filed: Jul. 29, 2014

(86) PCT No.: PCT/CH2014/000115
§ 371 (c)(1),
(2) Date: Jan. 28, 2016

(87) PCT Pub. No.: WO2015/013832
PCT Pub. Date: Feb. 5, 2015

(65) Prior Publication Data
US 2016/0169536 A1  Jun. 16, 2016

Related U.S. Application Data

(60) Provisional application No. 61/860,389, filed on Jul. 31, 2013.

(51) Int. Cl.
*F24C 15/24* (2006.01)
*H01L 21/67* (2006.01)
(52) U.S. Cl.
CPC ........ *F24C 15/24* (2013.01); *H01L 21/67115* (2013.01)

(58) Field of Classification Search
CPC . H01L 21/67115; H05B 3/009; H05B 3/0047; A61N 5/06; F26B 3/30
USPC .......... 392/411, 416; 118/724, 728; 219/390, 219/405, 411
See application file for complete search history.

(56) References Cited

U.S. PATENT DOCUMENTS

| | | |
|---|---|---|
| 5,268,989 A | 12/1993 | Moslehi |
| 6,108,490 A | 8/2000 | Lee |
| 6,559,424 B2 * | 5/2003 | O'Carroll ............. C23C 16/481 118/50.1 |
| 8,273,670 B1 | 9/2012 | Rivkin |
| 2002/0007797 A1 | 1/2002 | Stevens |
| 2003/0038128 A1 | 2/2003 | Suzuki |

(Continued)

FOREIGN PATENT DOCUMENTS

| | | |
|---|---|---|
| CN | 201839454 U | 5/2011 |
| EP | 0 811 709 A2 | 12/1997 |

(Continued)

*Primary Examiner* — Tu B Hoang
*Assistant Examiner* — Thomas J Ward
(74) *Attorney, Agent, or Firm* — Pearne & Gordon LLP

(57) ABSTRACT

An electrical radiation heater arrangement for a vacuum enclosure includes at least two sets of linear heating sources, arranged in a corresponding number of concentric heating zones. The heating sources are arranged directly on the vacuum side of the vacuum enclosure and electrically connected to current rails arranged on the vacuum side with each of the current rails being connected to one electrical feedthrough from vacuum to ambient. Preferably, the heating sources are arranged in a polygon approaching a circle, essentially radially or a combination of both.

18 Claims, 4 Drawing Sheets

(56) References Cited

U.S. PATENT DOCUMENTS

| | | | | |
|---|---|---|---|---|
| 2004/0013419 | A1* | 1/2004 | Sakuma | C23C 16/481 |
| | | | | 392/411 |
| 2006/0291823 | A1* | 12/2006 | Su | H01L 21/67115 |
| | | | | 392/318 |
| 2008/0116196 | A1 | 5/2008 | Nakajima | |
| 2009/0116824 | A1* | 5/2009 | Suzuki | H01L 21/67115 |
| | | | | 392/411 |
| 2009/0214193 | A1 | 8/2009 | Suzuki | |
| 2015/0147053 | A1* | 5/2015 | Ranish | H05B 3/0047 |
| | | | | 392/411 |

FOREIGN PATENT DOCUMENTS

| | | |
|---|---|---|
| EP | 1 197 989 A2 | 4/2002 |
| JP | H11-008204 A | 1/1999 |
| JP | 2001-210604 A | 8/2001 |
| JP | 2002-075898 A | 3/2002 |
| JP | 2002-075899 A | 3/2002 |
| JP | 2003-289042 A | 10/2003 |
| JP | 2004-186346 A | 7/2004 |
| JP | 2004-241565 A | 8/2004 |
| JP | 2010-225342 A | 10/2010 |
| JP | 2012-068002 A | 4/2012 |
| KR | 10-2003-0072073 A | 12/2004 |
| WO | 01/82348 A1 | 11/2001 |

* cited by examiner

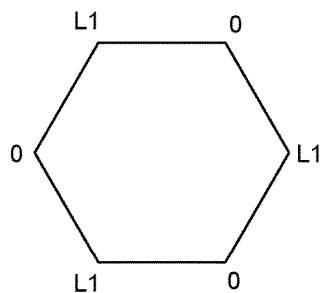
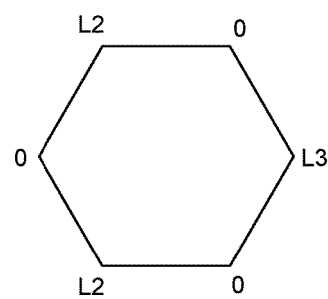
Figure 2A
Figure 2B
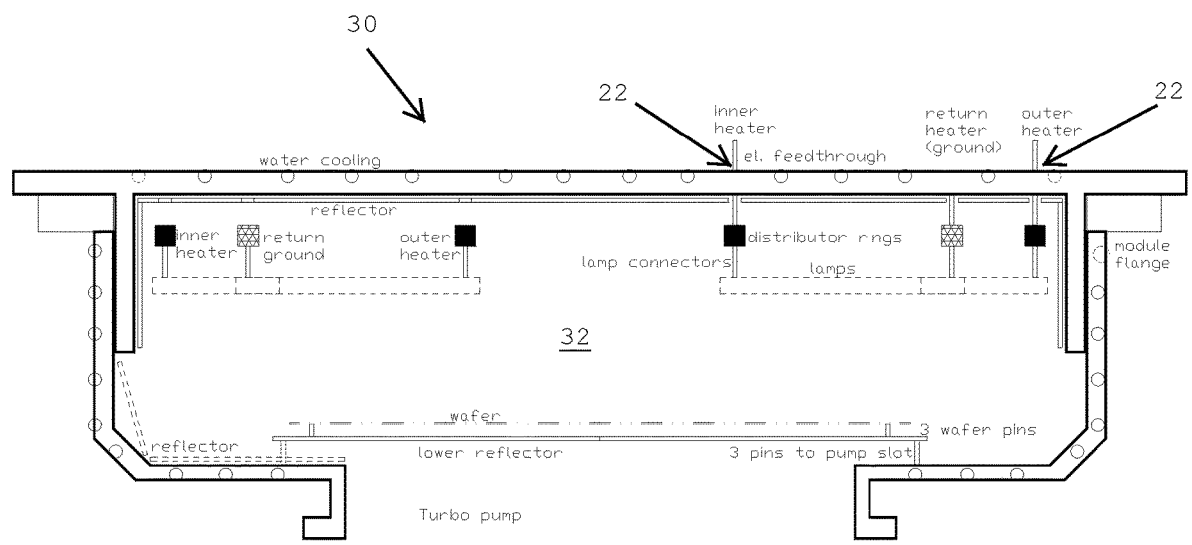
Figure 3

## RADIATION HEATER ARRANGEMENT

This invention relates to an improved heating system for heating substrate materials like silicon wafers, glass substrates or alike. A preferred application is heating these substrates in a vacuum system for subsequent thin film deposition at elevated temperatures. It is the aim of the current invention to optimize the temperature distribution of a substrate by arranging the heaters in a simple and at the same time effective way to reduce cost and maintenance efforts.

BACKGROUND OF THE INVENTION

Many coating applications under vacuum require uniform heating of materials (subsequently called "substrates") to elevated temperatures, sometimes to several hundred degrees Celsius in short time. At these high temperatures heat radiation is a significant—sometimes the most relevant—way of heat transfer between a substrate and its surrounding. When heating time is critical, heating of the substrate is preferably not accomplished by heat conductance (e.g. by placing the substrate in direct intimate contact to a hot basis) but by heat radiation. Depending of the absorption characteristic of the substrate materials UV, visible or infrared light is used as energy source for radiative heating.

Since heating devices are limited in size, substrates usually suffer from radiation loss especially at the edges and corners of the substrate and/or inhomogeneous heat distribution over the area to be heated. Uniform temperature distribution is very difficult to achieve. For high temperature thin film deposition this non-uniform temperature distribution may lead to un-wanted non-uniform thin film properties (crystallography, stress, resistivity, optical properties).

To overcome these problems, this invention consequently relates to a 2-zone radiation heater for round substrates with a minimized number of electrical feedthroughs.

TECHNICAL BACKGROUND

In the following, several embodiments of lamp-heating embodiments are being addressed. The list does not claim to be exhaustive or concluding and the characterization of some of the documents to be thorough and comprehensive.

Arrays of lamps like point sources are used in several publications like EP811709A2, U.S. Pat. No. 8,273,670B1 and US20060291823A1. In many applications, like US20080116196A1 or U.S. Pat. No. 5,268,989A, the lamps are situated behind a window.

Linear lamp arrays are used in US20020007797.

JP2012068002A claims patterns of rod-like infrared lamps 11 on a plane in parallel, arranging a plurality of rod-like infrared lamps in a plane combined with a pattern in orthogonal direction. Also JP2001210604A uses an orthogonal lamp pattern. KR2003072073A proposes orthogonal lamp patterns with reduced radiation density in the wafer centre.

CN201839454U claims a heater array, which includes multiple heating lamp tubes with a gradient in intensity to achieve uniformly heating of the central part and the peripheral part of the wafer. US20090214193A1 and JP2010225342A use special linear lamps with a non-irradiative portion in the inner part of the lamp.

Filaments arranged in shape of a lattice are proposed in JP2003289042A.

Ring-shaped lamp heaters with different radii, arranged concentrically with respect to wafer placed inside processing chamber are used in JP2004241565A and US20030038128A1.

JP11008204A uses partly ring-shaped lamp heaters.

JP2004186346A, JP2002075899A, JP2002075898A use ring-shaped lamp heaters

Lamp heater arrays with multiple zone ring lamps and reflecting side walls are described in EP1197989A2.

Lamp heater arrays with multiple zone ring lamps and arrangements of linear lamps are described in WO 0182348 A1. The lamps are separated from the vacuum by a window.

In several applications, like U.S. Pat. No. 6,108,490, the substrate is rotating.

US20090116824A1 describes linear lamp arrays and the drive units supplying power to lamps, where power control unit controls drive units for supplying power to filaments of respective filament groups

DEFICIENCIES OF THE PRIOR ART

The existing solutions usually have at least one of the following disadvantages:

a) A 2-zone or multi-zone heater is not possible b) They require a window, which reduces the efficiency of the lamps c) They require several electrical feedthroughs for the lamp arrays

SHORT DESCRIPTION OF THE FIGURES

FIGS. 2A and 2B show wiring diagrams for a 3-phase power supply with power levels of the 3 phases like: Inner heater (FIG. 2A) L1: 3 kW and outer heater (FIG. 2B) L2: 4 kW and L3: 2 kW;

FIG. 3 shows the cross section of a degasser with an arrangement of 3 current rails and 2 electrical feedthroughs;

SOLUTION ACCORDING TO THE INVENTION

All embodiments shown and described herein have in common to rely on at least two concentric heating zones with conducting rails on the vacuum side for supplying electrical power to lamps of a radiation heater arrangement. These conducting rails are connected to a minimum number of electrical feedthroughs in a vacuum enclosure 30 from the vacuum or process chamber 32 to the ambient.

A first embodiment uses at least two sets of linear standard lamps in a vacuum chamber 32 to be arranged in a polygon approaching a circle, where the lamp endings are connected to a minimum number of common electrical points. These electrical points are connected via conducting rails on the vacuum side of the lamp setup. The conducting rails are connected to a minimum number of electrical feedthroughs from the vacuum or process chamber 32 to the ambient.

In a second embodiment at least two sets of lamps are essentially radially arranged between circular current rails which again are connected to a minimum number of electrical feedthroughs from the vacuum or process chamber 32 to the ambient.

The term lamps shall here mean an electric light which produces light with a filament wire heated to a high temperature by an electric current passing through it, until it glows. The hot filament is protected from oxidation with a glass bulb that is filled with inert gas (or evacuated). In a halogen lamp, filament evaporation is prevented by a chemical process that redeposits metal vapor onto the filament, extending its life. The light bulb is supplied with electrical current by feedthrough terminals or wires embedded in the glass. Most bulbs are used in a socket which provides mechanical support and electrical connections. For heating purposes halogen lamps with powers of several hundred to thousands of watt are common. Preferably those heating lamps are rod-shaped.

Example 1

Figure 1A:
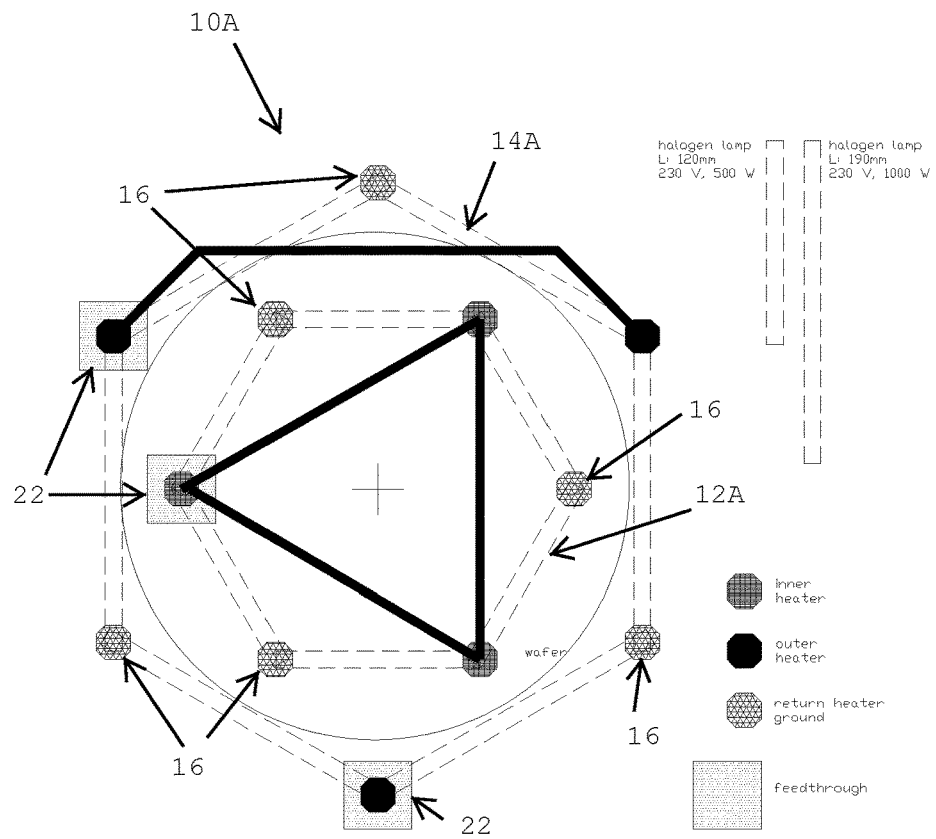
FIGS. 1A and 1B show lamp arrangements in 2 hexagons using 3 (FIG. 1A) or 2 (FIG. 1B) electrical feedthroughs.
Figure 1B:
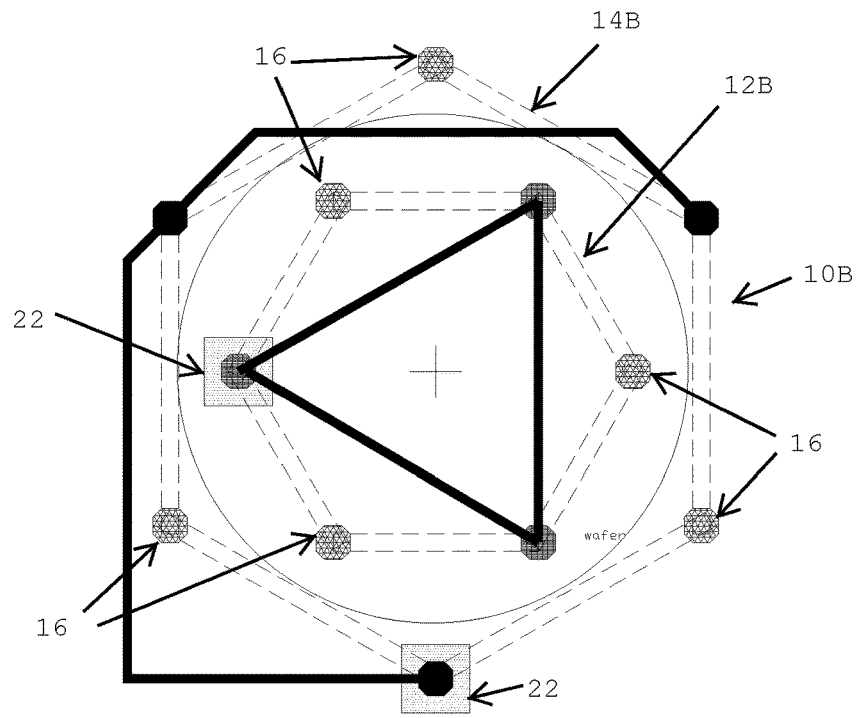
Figure 4:
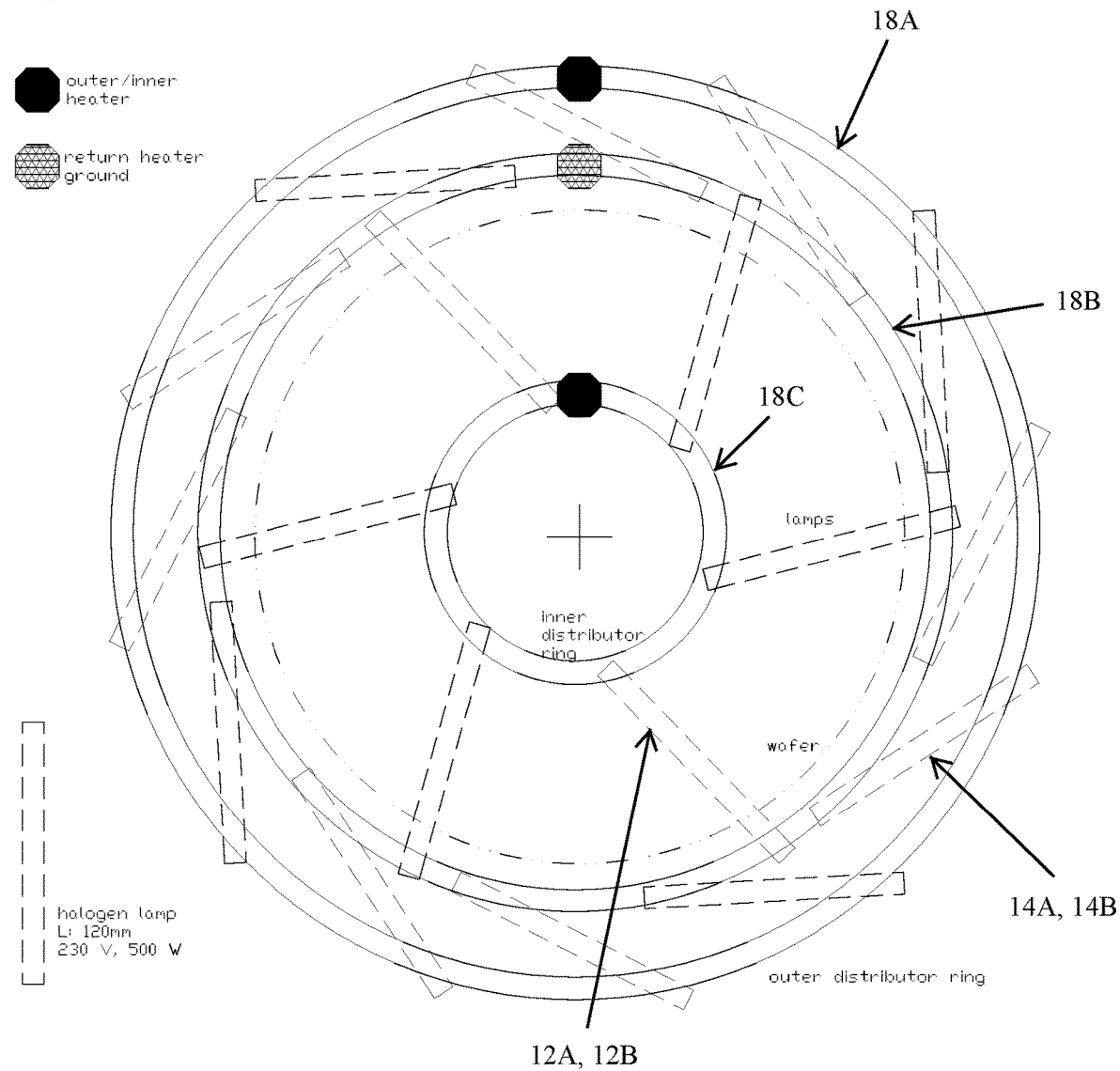
FIG. 4 shows a top view of a lamp arrangement with 3 current rails and 2 electrical feedthroughs.

FIGS. 1A and 1B show top views of lamp arrangements 10A, 10B, where 2 hexagons are set together concentrically, one being rotated by 30° vs. the other. An inner heater 12A, 12B uses 6 lamps of 120 mm length with a maximum power of 500 Watt per lamp, while an outer heater 14A, 14B uses 6 lamps of 190 mm length with a maximum power of 1000 Watt per lamp. Each of the hexagons thus forms a heating zone with a specific heating output. Every second edge of both hexagons is used as ground connection 16, which can be connected to the housing of the degasser arrangement. For the input current the remaining 3 edges are connected, preferably by current rails 18A, 18B, 18C (FIG. 4). Each of these current rails 18A, 18B, 18C are attached to one electrical feedthrough 22, or like (see FIG. 1A) the outer heater 14A may be connected to 2 contacts to one rail and 1 contact to a separate feedthrough (for three phase operation mode). In FIGS. 2A, 2B the wiring diagram for a 3-phase power supply is depicted. In FIG. 2A the inner hexagon is connected to L1, while in FIG. 2B two lamps of the outer hexagon are connected to L2 and one lamp is connected to L3. This wiring takes the fact into account that the inner heater 12A, 12B needs less power to achieve good temperature uniformity on a 300 mm substrate. The power levels of the 3 phases can then be set to typical values like:

L1: 3 kW L2: 4 kW L3: 2 kW

By this wiring the load of the three phases of a power supply can be more balanced than just using 2 phases. Each of the 3 phases is adjusted by a thyristor control to achieve the desired temperature uniformity on the substrate.

Example 2

FIG. 3 shows the cross section of a degasser with an arrangement of 3 current rails 18A, 18B, 18C and only 2 electrical feedthroughs 22. As sketched in top view FIG. 4 the inner heater 12A, 12B consists of 6 lamps of 120 mm length with a maximum power of 500 Watt per lamp and the outer heater 14A, 14B uses 12 lamps of the same type. The higher power for the outer heater 14A, 14B is required to achieve the temperature uniformity on the substrate. The ratio between the 2 heater powers is adjustable. Using one lamp type is an advantage for maintenance and logistic reasons. The lamps are attached to 3 circular conducting rails 18A, 18B, 18C, where the outer rails 18A, 18C are connected the heater power of the inner and the outer heater zones. The middle conducting rail 18B is connected to ground.

It is further preferred to cover the ends and contact regions of the lamps by covering shields so that the mutual heating of the feedthroughs and contacts of the lamps can be minimized.

Figure 5A:
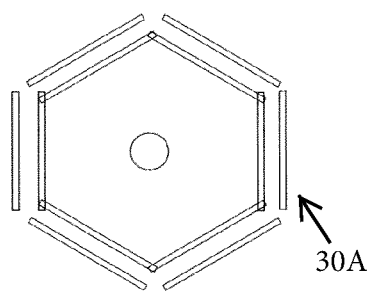
FIGS. 5A and 5B shows further lamp arrangements.
Figure 5B:
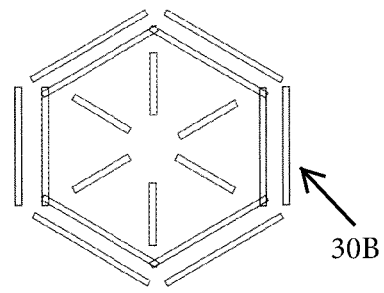

Two further lamp arrangements 30A, 30B with inner and outer heater are sketched in FIGS. 5A and 5B.

What is claimed is:

1. An electrical radiation heater arrangement including a vacuum enclosure, the electrical radiation heater arrangement disposed in the vacuum enclosure and comprising:
   at least two sets of linear heating sources, arranged in a corresponding number of concentric heating zones,
   each of said sets of linear heating sources being arranged directly on a vacuum side of the vacuum enclosure and the linear heating sources of each set having a first end electrically connected to another linear heating source and a second end electrically connected to a common current rail arranged on the vacuum side, and
   with each of the common current rails being connected to one electrical feedthrough that passes through a wall of the vacuum enclosure from vacuum to ambient.

2. The electrical radiation heater arrangement according to claim 1, wherein in at least one of the concentric heating zones the linear heating sources are arranged in a polygon approaching a circle.

3. The electrical radiation heater arrangement according to claim 1, wherein the linear heating sources in at least one of the concentric heating zones are arranged essentially radially.

4. The electrical radiation heater arrangement according to claim 1, wherein in one of the heating zones the linear heating sources are arranged in a polygon approaching a circle and in a further one the heating zones are arranged essentially radially.

5. The electrical radiation heater arrangement according to claim 1, wherein the linear heating sources are lamps.

6. The electrical radiation heater arrangement according to claim 5, wherein the lamps are halogen lamps.

7. The electrical radiation heater arrangement according to claim 1, wherein a set of linear heating sources is connected to each common current rail.

8. The electrical radiation heater arrangement according to claim 7, wherein the set of linear heating sources are connected electrically to the common current rail in parallel.

9. The electrical radiation heater arrangement according to claim 1, wherein each of the common current rails is connected to only one feedthrough.

10. An apparatus including:
    a vacuum enclosure; and
    an electrical radiation heater arrangement disposed in the vacuum enclosure and comprising:
       at least two sets of linear heating sources, arranged in a corresponding number of concentric heating zones,
       each of said sets of linear heating sources being arranged directly on a vacuum side of the vacuum enclosure and the linear heating sources of each set having a first end electrically connected to another linear heating source and a second end electrically connected to a common current rail arranged on the vacuum side, and
       with each of the common current rails being connected to one electrical feedthrough that passes through a wall of the vacuum enclosure from vacuum to ambient.

11. The apparatus according to claim 10, wherein in at least one of the concentric heating zones the linear heating sources are arranged in a polygon approaching a circle.

12. The apparatus according to claim 10, wherein the linear heating sources in at least one of the concentric heating zones are arranged essentially radially.

13. The apparatus according to claim 10, wherein in one of the heating zones the linear heating sources are arranged in a polygon approaching a circle and in a further one the heating zones are arranged essentially radially.

14. The apparatus according to claim 10, wherein the linear heating sources are lamps.

15. The apparatus according to claim 14, wherein the lamps are halogen lamps.

16. The apparatus according to claim 10, wherein a set of linear heating sources is connected to each common current rail.

17. The apparatus according to claim 16, wherein the set of linear heating sources are connected electrically to the common current rail in parallel.

18. The apparatus according to claim 10, wherein each of the common current rails is connected to only one feedthrough.

\* \* \* \* \*